United States Patent [19]

Trush

[11] 3,961,273

[45] June 1, 1976

[54] FREQUENCY MEMORY APPARATUS

[75] Inventor: Victor Trush, Nashua, N.H.

[73] Assignee: Sanders Associates, Inc., Nashua, N.H.

[22] Filed: June 19, 1972

[21] Appl. No.: 264,123

[52] U.S. Cl. ............................... 328/155; 328/140
[51] Int. Cl.² ...................... H03B 3/04; H03K 5/18
[58] Field of Search ............ 307/232; 328/155, 140

[56] References Cited
UNITED STATES PATENTS

| | | | |
|---|---|---|---|
| 3,436,647 | 4/1969 | Gobeli et al. .................. | 328/155 X |
| 3,528,018 | 9/1970 | Corson ........................... | 328/155 X |
| 3,579,128 | 5/1971 | Smith et al. ....................... | 328/155 |
| 3,624,274 | 11/1971 | Araki et al. ..................... | 328/155 X |

*Primary Examiner*—Malcolm F. Hubler
*Attorney, Agent, or Firm*—Louis Etlinger; Richard I. Seligman

[57] ABSTRACT

Frequency memory apparatus in which an input signal is stored in a regenerative oscillatory loop. The phase delay of the loop is adjusted during the time of the first recirculation of the pulse in increments of 90° in one embodiment and increments of 180° in another embodiment so as to concentrate the output power at the frequency of the input signal. Other illustrated features include a relatively long term multi-loop frequency memory, enhancement of the input dynamic range and elimination of a phase error problem in the first recirculated pulse.

17 Claims, 10 Drawing Figures

FREQUENCY MEMORY APPARATUS

BACKGROUND OF THE INVENTION

1. Field of Invention

This invention relates to novel and improved memory devices and in particular to frequency memory apparatus in which an input signal is stored in a regenerative ocsillatory loop.

Frequency memories are useful in repeater aplications wherein it is necessary to regenerate an input signal with substantially no deviation in frequency. For example, frequency memories are especially useful in jamming applications wherein it is desirable to regenerate a signal in response to a received signal such that the frequency of the regenerated signal closely approximates that of the received signal.

2. Prior Art

Prior art frequency memories generally involve the recirculation of a signal in an oscillatory loop which includes an amplifier and a delay line. In order to sustain the oscillation, the total gain around the loop must be substantially unity and the net phase delay or shift in the loop must be an integral multiple of $2\pi$ radians (360°) at the frequency of the signal to be stored. For a phase delay around the loop of T (which is due largely to the delay line), oscillation can be sustained within the loop at any of a set of frequencies with frequency spacing $\Delta F$, where $\Delta F = 1/T$. At any of these frequencies (sometimes called loop modal frequencies) and unity gain, ideal frequency memory occurs.

In such prior art frequency memories, the phase delay T does not often equal a multiple of $2\pi$ radians at the input signal frequency. This results in spectral spreading of the output power. That is, the output power is not concentrated at the input frequency. When the phae delay T is an integral multiple of $2\pi$ radians at the input signal frequency (in phase condition), the output power attenuation is minimized. However, as the phase delay or shift deviates from the in phase condition, the output power becomes more and more attenuated with maximum attenuation occurring at the 180° phase shift condition.

BRIEF SUMMARY OF THE INVENTION

An object of the present invention is to provide a novel and improved frequency memory.

Another object is to provide a novel and improved frequency memory in which frequency error is substantially reduced.

Still another object is to provide a novel and improved oscillatory loop memory in which the loop phase delay is adjusted to decrease frequency error.

Yet another object is to provide a novel and improved frequency memory in which spectral spreading of the output power is greatly reduced.

Briefly, frequency memory apparatus embodying the present invention includes an amplifier and a delay line coupled in an oscillatory loop. The loop responds to an applied input pulse of periodic signal to recirculate the pulse. A correlator correlates the input pulse with the first recirculated version of itself. A phase adjustor responds to the correlating means correlator to adjust the phase delay of the loop in a direction to optimize the memory output power at the frequency of the periodic signal. Preferably the delay interval of the delay line is less than the width of the input pulse such that the correlation occurs prior to the termination of the input pulse.

In one embodiment of the invention, the correlating means produces a single phase correlation signal which is employed by the phase adjustor for a two state phase adjustment (0° and 180°). In another embodiment of the invention, a pair of phase correction signals is employed by the phase adjustor to produce a four state phase adjustment (90° increments of phase).

In accordance with a further embodiment of the invention, the oscillatory loop includes a multistate attenuator which is operated automatically to adjust the attenuation within the loop such that the power level of the first recirculated pulse more nearly corresponds with the input pulse power level so as to enhance the input dynamic range of the frequency memory. In yet another embodiment, the first recirculated pulse is prevented from again traversing the oscillatory loop until the correlation and phase adjustment process has been complete.

In still another embodiment of the invention, an additional delay line having a relatively longer delay is employed for the purpose of providing longer term storage of the input pulse.

BRIEF DESCRIPTION OF THE DRAWING

In the accompanying drawing like reference characters denote like structural elements, and.

DESCRIPTION OF PREFERRED EMBODIMENT

Figure 1:
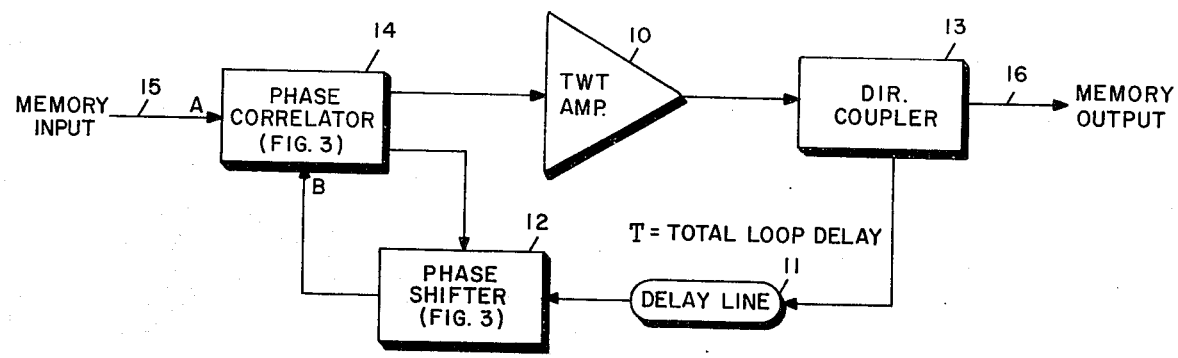
FIG. 1 is a block diagram of frequency memory apparatus embodying the present invention.

With reference now to FIG. 1, frequency memory apparatus embodying the invention includes an amplifier 10, a delay line 11 and a phase shifter 12 which are coupled in an oscillatory loop by means of a directional coupler 13 and a phase comparator 14. An input signal A is applied to the memory input terminal 15 at the input of the phase comparator 14 and the memory output is taken from the directional coupler 13 on lead 16. The loop gain is made substantially equal to unity so as to sustain oscillation at any of the loop modal frequencies. The loop modal frequencies are separated by frequency spacings of $\Delta F = 1/T$, where T is the total phase delay about the loop.

Figure 2:
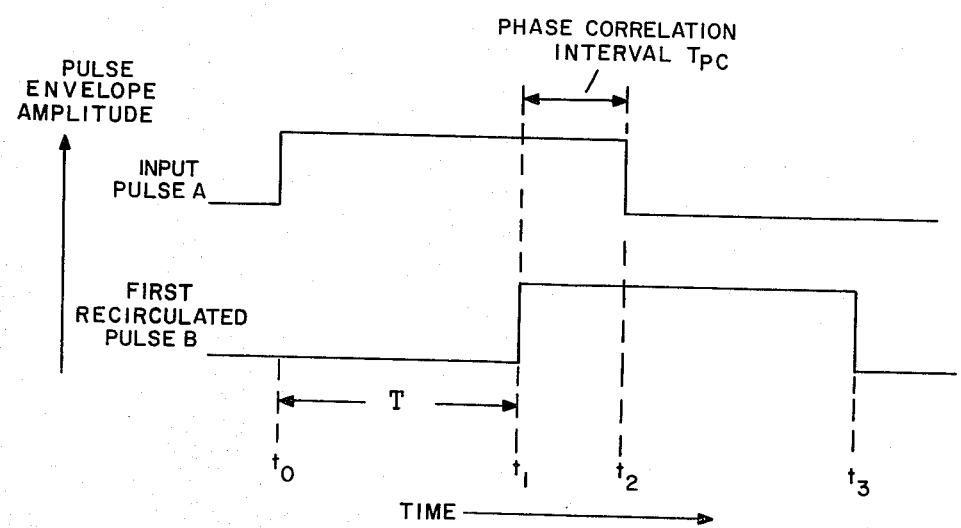
FIG. 2 is a timing diagram which illustrates the phase correction interval for the FIG. 1 frequency memory.

In accordance with the present invention, the loop delay T is adjusted on an input pulse by pulse basis so as to minimize spectral spreading of the output power. This is achieved by means of the phase shifter 12 which adjusts the total phase delay T in response to a phase correction signal from the phase comparator 14. The phase comparator 14 is active during a phase correlation interval ($t1$ to $t2$ in FIG. 2) to compare the input pulse A of periodic signal with the first recirculated version B of itself. In the FIG. 2 plot of pulse envelope amplitude versus time, the phase delay T ($t0$ to $t1$) is made less than the input pulse width ($t0$ to $t2$) so as to allow an adequate time for the phase correlation. In this example, the input pulse A width of $t0$ is $t2$ is equal to the recirculated pulse B width $t1$ to $t3$.

The travelling wave tube (TWT) amplifier 10, directional coupler 16 and delay line 11 may take the form of known components. Phase comparator 14 and the phase shifter 13 will be described in detail for an exemplary frequency memory system in which the phase delay is adjusted in increments of 90° such that the phase delay deviation from a multiple of $2\pi$ is never greater than $\pi/4$ or 45°. This reduces the possible frequency error by a factor of four as compared to a non-corrected loop. For example, in a 100 nanosecond phase delay loop the maximum frequency error of the stored frequency can be as great as 5.0 MHz because of the 10 MHz mode spacing. For the same size loop using the phase adjusting technique of the present invention the maximum error is reduced to 1.25 MHz. This is significant since it allows not only more power into the memory sytem but also the use of smaller phase delay and less lossy loops, thereby enabling the loop memories to be extended into the higher frequency bands.

Figure 3:
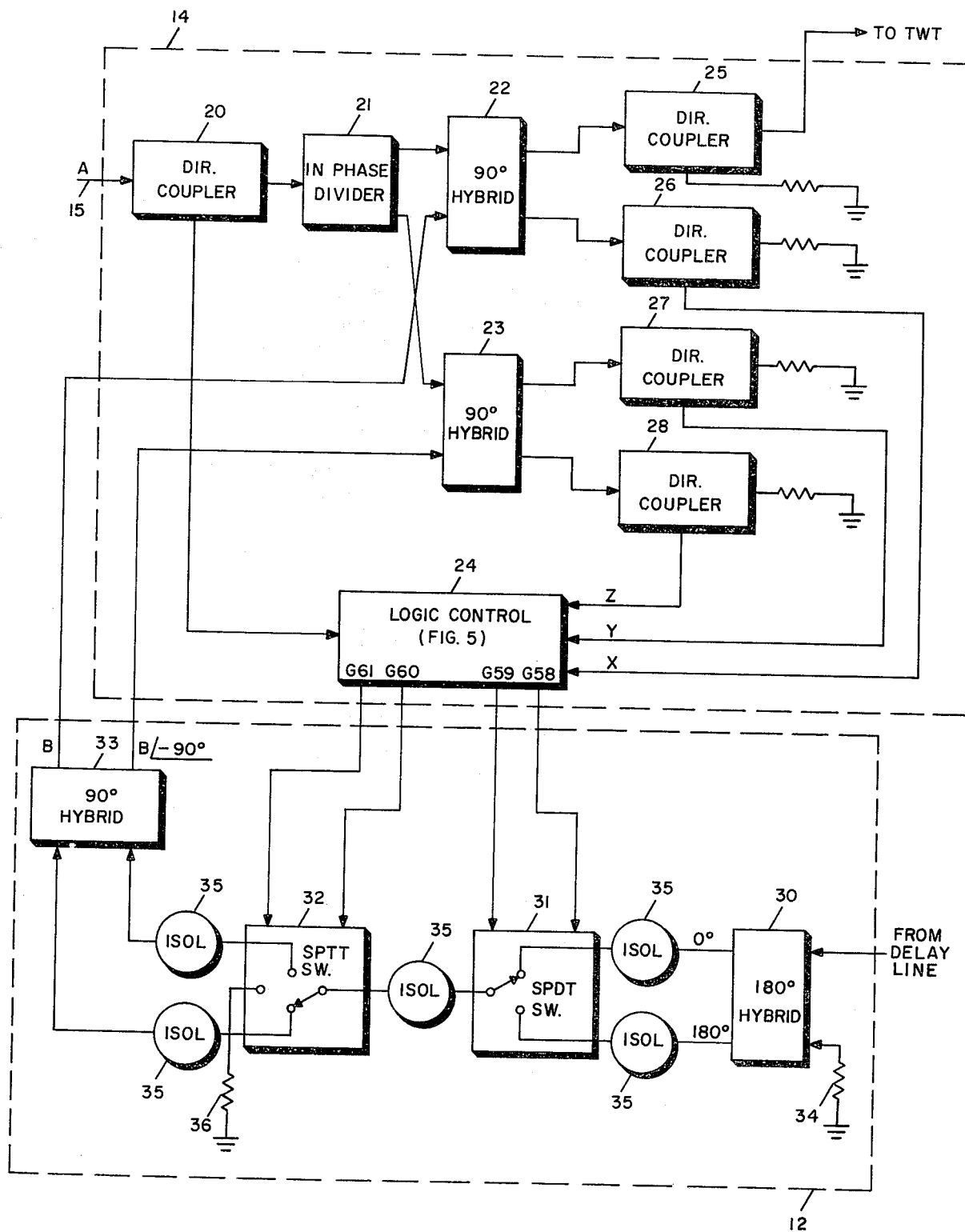
FIG. 3 is a more detailed block diagram of the phase correlator and phase shifter of the FIG. 1 frequency memory.

Referring now to FIG. 3, the phase comparator 14 includes a directional coupler 20 which couples the input signal A to an inphase power divider 21 and to a logic section 24. The inphase power divider 21 applies the signal A to the upper input port of a 90° hybrid coupler 22 which together with another 90° hybrid coupler 23 and directional couplers 25 through 28 comprise a phase correlating section. The hybrid network 22 receives at its bottom input port the recirculated pulse B. The hybrid network 23 also receives at its bottom input port the signal B with a phase shift of 90°. The upper output port of the hybrid network 22 is coupled by way of the directional coupler 25 to the input of the TWT amplifier 10 (FIG. 1). The directional coupler 26 couples the bottom output port of the hybrid network 22, also designated at X, to the logic network 24. The directional couplers 27 and 28 couple the top and bottom output ports of the hybrid network 23, Y and Z, respectively, to the logic network 24. The resistor elements which are connected to each of the directional couplers 25 to 28 serve as dummy loads to prevent undesirable signal reflections.

Figure 4:
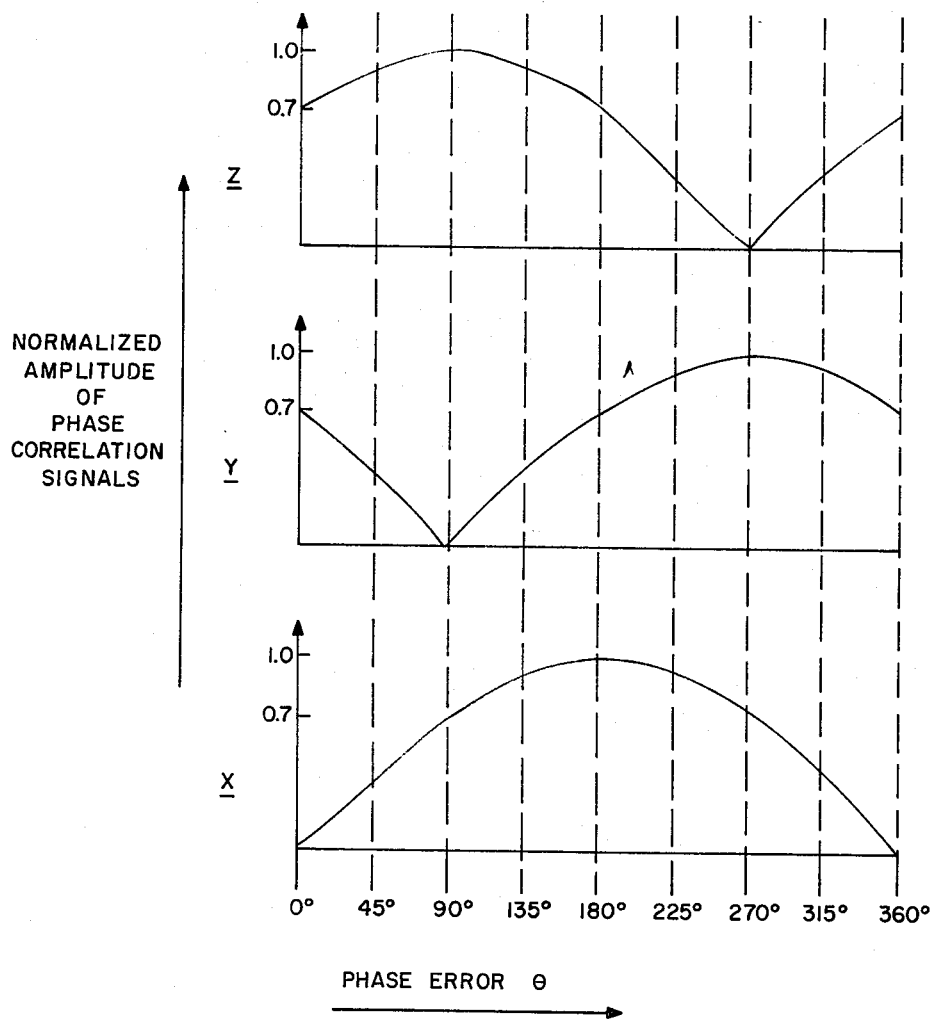
FIG. 4 is a graph of the normalized amplitude of the phase correction signals as a function of phase error.

The graph in FIG. 4 shows the normalized amplitude values of the phase correlation signals X, Y and Z as a function of the relative loop phase error 0 at the input of the TWT amplifier 10. Due to the −90° phase shift of the signal B through the hybrid network 22, the relative phase error at the input to the phase comparator 14 is 90° different from that at the input to the amplifier 10. That is, phase errors of 0°, −90°, −180° and −270° at the input to the amplifier 10 correspond to phase errors of +90°, 0°, −90° and −180°, respectively, at the input to the phase comparator 14.

The logic control network 24 responds to the input signal A to compare the phase correlation signals X, Y and Z during the phase correlation interval. of $t1$ to $t2$ (FIG. 2) so as to provide a phase correction signal to the phase shifter 12. The logic control 24 continues to be active thereafter so as to apply the phase correction signal to the phase shifter 12 during the entire storage period of the frequency memory.

Still referring to FIG. 3, phase shifter 12 includes a 180° hybrid network 30 and a 90° hybrid network 33 arranged to provide loop phase shifts in increments of 90°. To this end, the upper input port of the 180° hybrid network 30 receives the loop signal from the delay line 11 (FIG. 1). Its bottom input port is coupled via a dummy load 34 to ground so as to prevent undesirable signal reflections. Its top (0°) and bottom (180°) output ports are coupled via a single pole double throw switch 31, a single pole triple throw switch 32 and a number of isolator elements 35 to the input ports of the 90° hybrid network 33. The switches 31 and 32 ae controlled by the phase correction signals provided by the logic control 24 to select either the 0° or the 180° output port of hybrid network 30 for connection to the left hand (in phase) input port or to the right hand (quadrature phase) input port of the 90° hybrid network 33. As shown in FIG. 3, the phase correction signal appears on four leads from the logic control 24. Two of these leads, designated as G58 and G59 are applied to the switch 31 and the other two, designated as G60 and G61 are coupled to the switch 32. For the 0° phase shift setting (the illustrated switch position), G58 and G60 leads apply switching signals to the switches 31 and 32 so as to couple the 0° output port of the hybrid 30 to the inphase port of the hybrid 33. For a phase shift of 180°, the G59 and G60 leads cause the switches 31 and 32 to couple the 180° output port of hybrid 30 to the inphase input port of hybrid 33. For a 90° phase shift, the G58 and G61 leads cause the switches 31 and 32 to couple the 0° output port of hybrid 30 to the quadrature phase input port of hybrid 33. Finally, for a 270° phase shift the G59 and G61 leads cause the switches 31 and 32 to couple the 180° output port of hybrid 30 to the quadrature phase input port of hybrid 33.

The center or off position of the single pole triple throw switch 32 is connected to ground by way of a resistor termination 36. The switch 32 is held in the center position by the signals on the G60 and G61 leads whenever the frequency loop is not storing a signal. The isolators 35 serve to maintain good impedance matching between the switches and couplers so as to reduce the composite circuit insertion loss.

The recirculated signal B appears at the left hand output port of 90° hybrid 33. The same signal also appears at an angle of −90° at the right hand output port of hybrid 33. Both of these signals are coupled to the phase comparator 14.

Figure 5:
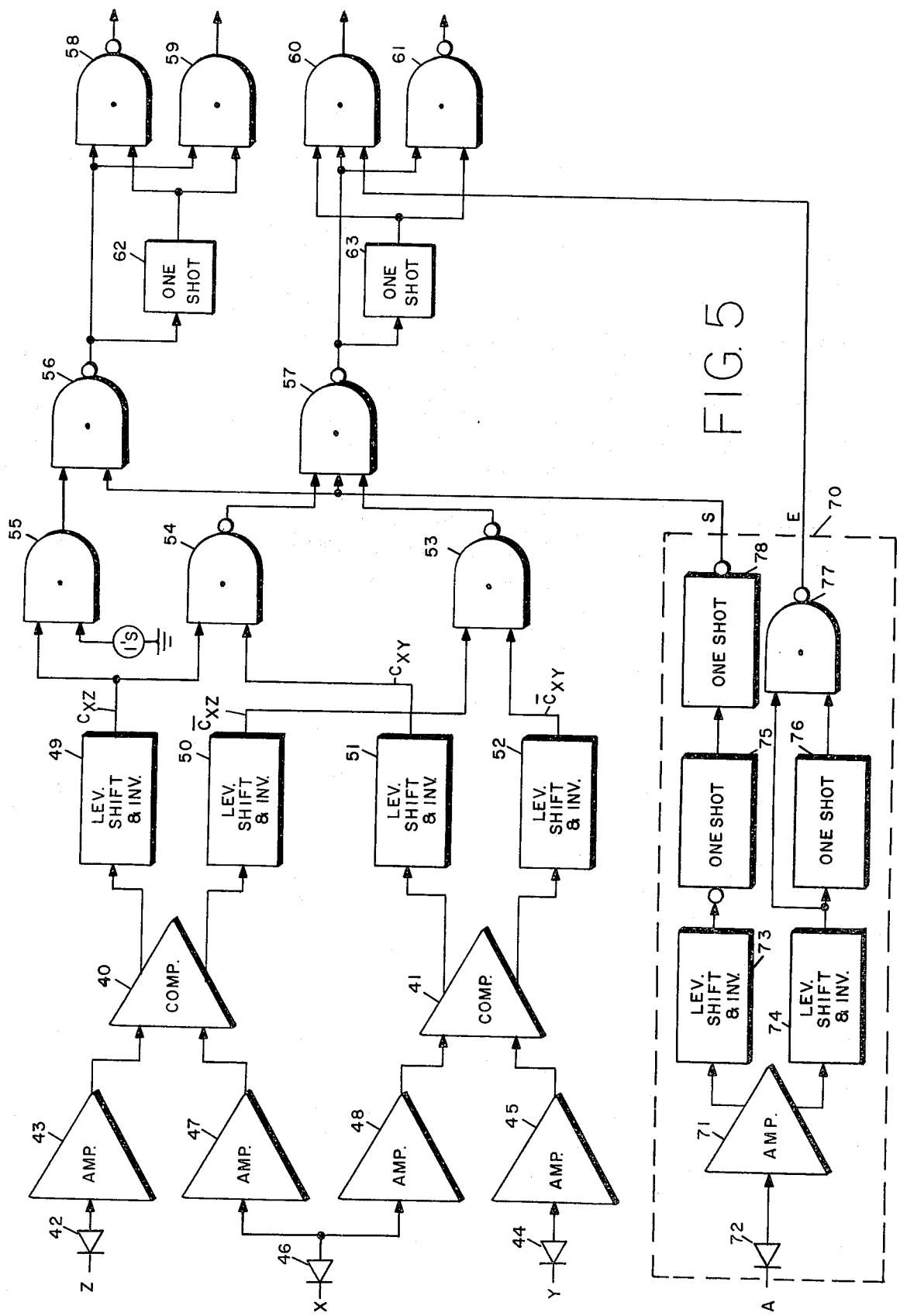
FIG. 5 is a block diagram, in part, and a logic schematic, in part, of the logic control portion of the phase correlator.

The amplifier, comparator, one shot multivibrator and logic gates shown in the FIG. 5 schematic diagram of the logic control network may take on any suitable form. For example, these known circuits may be selected from any or all of the following catalogs: Catalog No. -CC201 of Texas Instruments, Inc., Linear IC Data catalog of Fairchild Semiconductor, and the 9602 Data Sheet of Fairchild Semiconductor.

The level shifting and inverting network may also take on any suitable form, for example, each of these within 45° of the ideal phase delay for the frequency of the input signal A.

The various conditions of the signals $C_{xy}$ and $C_{xz}$ in the corresponding outputs of the gates 54 to 61 (designated as G54 through G61) are shown in Table I for phase error increments of 45°. As shown on the bottom line of Table I, no phase correction is required for ±45° or less of phase error. A phase correction of 90° is initiated for phase error from 45° to 135°. A phase correction of 180° is initiated for phase error of from 135° to 225°. A phase correction of 270° is initiated for a phase error of from 225° to 315°.

the entire memory storage time even though the output of gate 57 will become a 1 at the end of the sample time. At the end of the frequency memory storage time, the signal E and the output of the one shot 63 will become 0 and 1, respectively, to thereby return the outputs of gates 60 and 61 to 0's.

In the embodiment of the invention thus far described, frequency memory phase correction is achieved during one recirculation. That is, the complete sequence of determining loop phase error and setting the phase shifter to the optimum phase state is initiated and completed during the time of the first

TABLE I

| Phase Error | 0° | 45° | 90° | 135° | 180° | 225° | 270° | 315° | 360° |
|---|---|---|---|---|---|---|---|---|---|
| $C_{xy}$ | 0 | 0 | 1 | 1 | 1 | 1 | 0 | 0 | 0 | 0 |
| $C_{xz}$ | 0 | 0 | 0 | 0 | 1 | 1 | 1 | 1 | 0 | 0 |
| G53 | 0 | 0 | 1 | 1 | 1 | 1 | 1 | 1 | 0 | 0 |
| G54 | 1 | 1 | 1 | 1 | 0 | 0 | 1 | 1 | 1 | 1 |
| G55 | 0 | 0 | 0 | 0 | 1 | 1 | 1 | 1 | 0 | 0 |
| G56 | 1 | 1 | 1 | 1 | 0 | 0 | 0 | 0 | 1 | 1 |
| G57 | 1 | 1 | 0 | 0 | 1 | 1 | 0 | 0 | 1 | 1 |
| G58 | 0 | 0 | 0 | 0 | 1 | 1 | 1 | 1 | 0 | 0 |
| G59 | 1 | 1 | 1 | 1 | 0 | 0 | 0 | 0 | 1 | 1 |
| G60 | 1 | 1 | 0 | 0 | 1 | 1 | 0 | 0 | 1 | 1 |
| G61 | 0 | 0 | 1 | 1 | 0 | 0 | 1 | 1 | 0 | 0 |
| Phase Correction | 0° | | 90° | | 180° | | 270° | | 0° | |

By way of example, the frequency memory operation will be described for an input signal A in which the phase error is 90°. Prior to receipt of the input signal A (prior to time t0 in FIG. 2), the output of gates 56 and 57 are 1's since the sample signal S is a zero. The outputs of one shot 62 and 63 are also 1's such that the outputs of gates 58, 59 and 61 are 0, 1 and 0, respectively.

The enable signal E is a 0 such that the output of gate 60 is a 0. The output of gate 59 being a 1, the switch 31 in FIG. 3 is connected to the 0° output port of the 180° hybrid 30. With the outputs of gates 60 and 61 being 0's the switch 32 is at center or off position.

When the input signal A is detected at time t0, the enable signal E becomes a 1. This causes the output of gate 60 to become a 1 so as to switch the switch 32 (FIG. 3) from its off position to the left hand or inphase input port of the 90° hybrid 33. For a 90° phase error (FIG. 4) the phase correlation signal X is greater than the correlation of signal Y and less than the correlation signal Z. This results in the signals $C_{xy}$ and $C_{xz}$ being 1 and 0, respectively, as shown in Table I. Also as shown in Table I, the outputs of Gate 53, 54 and 55 are 1, 1 and 0, respectively. At about time t1 (FIG. 2) the sample signal S becomes a 1 so as to sample the gates 56 and 57. At this time, the output of gate 56 remains a 1 and the output of gate 57 switches to a 0. This results in the outputs of gates 58 and 59 remaining as 0 and 1, respectively, such that the switch 31 (FIG. 3) remains connected to the 0° output port of the hybrid 30. On the other hand, the 1 to 0 transition at the output of gate 57 causes the output of gate 60 to become a 0 and the output of gate 61 to become a 1. This causes the switch 32 to switch to the right hand or quadrature phase input port of the 90° hybrid 33 to thereby effect a 90° phase shift. The one shot 63 also responds to the 1 to 0 transition at the output of gate 57 to provide a 0 at its output for the duration of the frequency memory storage time. This assures that the outputs of gates 60 and 61 will remain 0 and 1, respectively, throughout recirculated pulse. The loop phase delay T is made less than the pulse width of the input signal A so as to result in an overlap (correlation time) between the input pulse and the first recirculated pulse. In the embodiment illustrated in FIGS. 1 through 5, the first recirculated pulse which may or may not contain a phase error is allowed to recirculate in the loop.

Figure 6:
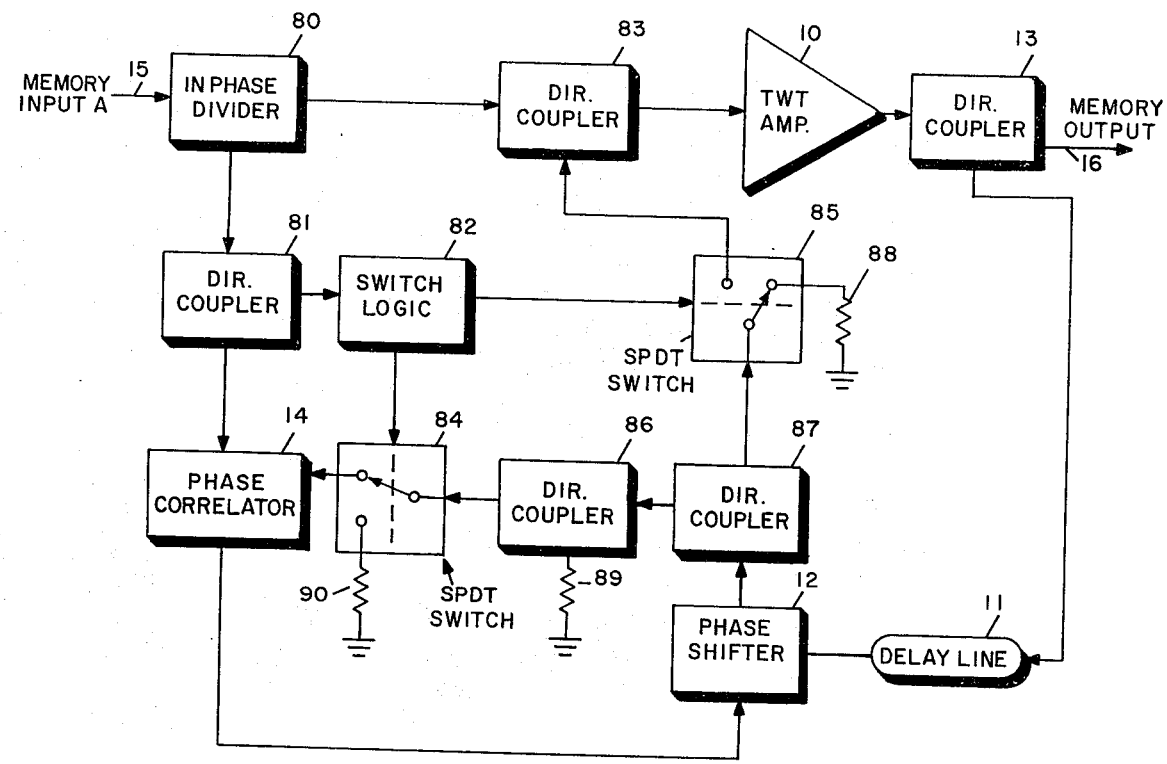
FIG. 6 is a block diagram of another frequency memory embodiment in which the problem of phase error in the first recirculated pulse is eliminated.

This problem of phase error in the first recirculated pulse is eliminated in the embodiment of the invention illustrated in FIG. 6. In the FIG. 6 embodiment, an "off line" phase correlation technique is employed to prevent the first recirculated pulse from recirculating in the loop. In this embodiment, the total loop phase delay is made equal to approximately one-half the input pulse width such that the first recirculated pulse exists during the second half of the input pulse interval. This first recirculated pulse is routed from the output of the phase shifter 12 via a pair of directional couplers 86 and 87 and a single pole double throw switch 84 to the phase correlator 14. At the same time this first recirculated pulse is dumped into a dummy load 88 by means of a connection from the directional coupler 87 to another single pole double throw switch 85. A switch logic network 82 responds to the start and end of the memory input signal A to control the positions of the switches 84 and 85. To this end, the memory input signal A is coupled via an inphase power divider 80 and a directional coupler 81 to both the phase correlator 14 and the switch logic 82. The other output of the phase divider 80 is applied to a directional coupler 83 which serves to pass either the input signal A or the recirculated pulse energy from the output of the switch 85 to the input of the loop TWT amplifier 10.

The switch logic 82 responds to the start of the input signal A to place the switches 84 and 85 into their illustrated switch positions such that the first recirculated pulse will be coupled by the directional coupler 87 to both the dummy load 88 and the phase correlator 14 during the phase correlation time (the second half of the input pulse A interval). Switch logic 82 then networks may suitably comprise a common emitter transistor amplifier which is designed to convert the signal output from a comparator or amplifier to the logic levels which are compatible with the logic gates and the one shots employed in the logic control network.

The logic gates and one shot shown in FIG. 5 are actuated by bilevel electrical signals applied thereto. When the signal is at one level, (say, the high level) it represents the binary digit 1 and when it is at the other level it represents the binary digit 0. Also, to simplify the discussion, rather than speaking of an electrical signal applied to a logic stage, it is sometime stated that a 1 or 0 is applied to block the stage.

Coincidence gates are represented in FIG. 5 by the conventional AND gate symbol having a dot therein. A small circle at the output of any of these gates represents signal inversion such that the AND gate becomes a NAND gate.

With reference now to FIG. 5, a pair of comparators 40 and 41 serve to compare the X phase correlation signal with the Z and Y phase correlation signals, respectively. To this end, the Z phase correlation signal is applied via a diode 42 and an amplifier 43 to one input of the comparator 40. The Y phase correlation signal is applied via a diode 44 and an amplifier 45 to one input of the comparator 41. The X phase correlation signal is applied via the diode 46 and amplifiers 47 and 48 to the other inputs of the comparators 40 and 41.

Each of the comparators 40 and 41 produces complimentary output signals which are shifted in signal level for processing by the logic gates in the right hand portion of FIG. 5. To this end, level shift and inverting circuits 49 and 50 receive the output signals from comparator 40 to produce at their outputs the comparison signals $C_{xz}$ and its $\overline{C}_{xz}$. On the other hand, level shifting and inverting circuits 51 and 52 receive the output signals from comparator 41 so as to produce at their respective outputs the comparison signals $C_{xy}$ and its complement $\overline{C}_{xy}$.

The $C_{xy}$ and $C_{xz}$ signals are combined in a NAND gate 54. The signal $\overline{C}_{xz}$ and $\overline{C}_{xy}$ are combined in another NAND gate 53. In order to match the signal delay through gates 53 and 54, the signal $C_{xz}$ is combined with a source of 1's (e.g., the voltage supply for the logic gates) in a NAND gate 55. The outputs of gates 53 and 54 are further combined in a NAND gate 57. The output of gate 55 is applied as an input to another NAND gate 56.

The NAND gates 56 and 57 are sampled once each storage time during the phase correlation interval $t1$ to $t2$ by a sample signal S which is derived from the input signal A by a signal detect circuit 70. The sample signal S is a 1 only during the phase correlation interval and is a 0 at all other times. This results in the outputs of the NAND gates 56 and 57 being 1 at all times except during the strobe or phase correlation interval. During the strobe or phase correlation interval the outputs of gate 56 and 57 can be either 0 or 1 depending upon the values of the signals at the inputs.

Since the gates 56 and 57 are sampled only during the phase correlation interval, circuitry must be provided to remember the sampled output states during the remainder of the loop memory storage period. To this end, the output of gate 56 is applied as an input to both a NAND gate 58 and an AND gate 59 as well as to a one shot multivibrator 62. The output of the one shot 62 is applied to both of the gates 58 and 59. In its stable state, the output of the one shot 62 is a 1. Its astable state (output value of 0), which is triggered by a 1 to 0 transition at the output of gate 56 during the sample time, has a duration which is equal to the storage time of the loop memory. That is, the one shot 62 serves to store a 0 which occurs at the output of gate 56 during the same time for the entire loop memory storage period.

In a similar manner, another one shot multivibrator 63 serves to remember a sampled 0 at the output of gate 57 during the phase correlation interval. To this end, the gate 57 has its output connected to an AND gate 60, NAND gate 61 and to the one shot 63. The one shot 63 has its output connected to both of the gates 60 and 61. The gate 60 also receives an enabling signal E from the signal detector circuit 70 which enables the gate 60 in response to the occurrence of an input signal for the duration of the loop memory storage period.

The input signal detector network 70 includes an amplifier 71 which receives the input signal A via a diode 72 from the directional coupler 20 (FIG. 3). The complimentary outputs of the amplifier 71 are employed to produce the sampling signal S and the enabling signal E. To this end, one of the outputs of amplifier 71 is applied via a level shift and inverting network 73 to a one shot multivibrator 75 which has a delay approximately equal to the loop delay T. The bubble at the input to one shot 75 signifies that it is triggered by a 0 to 1 transition rather than a 1 to 0 transition. The 1 to 0 transition which occurs at the output of one shot 75 at about time $t1$ (see FIG. 2) triggers a second one shot 78, the delay of which determines the pulse width of the sample pulse S at its output. The bubble at the output of one shot 78 signifies that its complement output (0 to 1 transition) is employed.

The other output of the amplifier 71 is applied via a level shifting and inverting network 74 to still another one shot multivibrator 76 and to a NAND gate 77. The other input of NAND gate 77 receives the output of the one shot 76. The one shot 76 is given a total time delay on the order of the total storage time of the frequency memory. In the absence of an input signal A, the outputs of the circuits 74 and 76 are both 1's such that the output E of gate 77 is a 0. When the input signal A is detected, the output of circuit 74 goes from 1 to 0, thereby triggering one shot 76 and causing NAND gate 77 to switch its state from 0 to 1. When the input signal A terminates, the output of circuit 74 returns from 0 to 1, but the output of one shot 76 remains a 0 throughout the entire storage period so as to maintain the output signal E of gate 77 as a 1. When the frequency memory storage time does terminate, the one shot 76 returns to its stable state such that gate 77 switches to return its output signal E to a 0.

In operation then, an input signal A is phase correlated with the first recirculated version B of itself to produce the phase correlation signals X, Y and Z. The signal X is compared with the signals Z and Y in comparators 40 and 41 to produce the phase correlated logic signals $C_{xz}$, $C_{xy}$ and their respective complements. These signals are further processed in gates 53 and 54 for identity of signal value and sampled by the signal S derived from the input signal detector 70 during the phase correlation interval. The results of this phase correlation sampling are employed to control the setting of the phase shifter 12 so as to correct the total phase delay around the frequency memory loop to responds to the end of the input signal A to reverse the position of the switches 84 and 85 so that the memory loop is closed and no further recirculated power is fed to the phase correlator 14.

The directional coupler 86 in the FIG. 6 embodiment serves to provide an additional phase shift in the signal path from the delay line to the phase correlator so as to compensate for the additional phase shift introduced into the memory loop by the directional coupler 83. The unused terminal of the coupler 86 is terminated in the dummy load 89. Also, the inactive terminal of the switch 84 is terminated in a dummy load 90.

In some cases the loop gain may be high enough such that the first recirculated pulse power exceeds the input pulse power. This can result in error in the detection of the 1 and 0 logic levels at the outputs of the comparators 40 and 41 (FIG. 5) of the phase correlator logic control 24 (FIG. 3). For example, when the input pulse and the first recirculated pulse are equal in power level, the ratio of the resultant comparator outputs which correspond to a logic 1 and a logic 0 is greater than 20:1. However, when the input pulse and first recirculating pulse are different in power level by 10 db the ratio of the resultant comparator outputs is less than 2:1.

Figure 7:
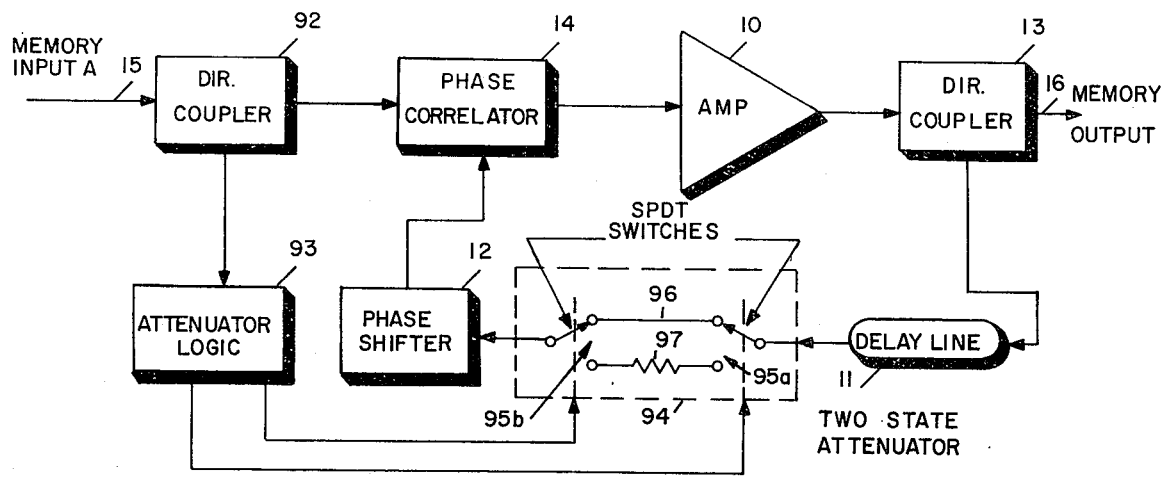
FIG. 7 is a block diagram of another frequency memory embodiment in which the input dynamic range is enhanced.

The embodiment shown in FIG. 7 enhances the input dynamic range of the frequency memory by adjusting the loop attenuation during the first recirculation so that the power level of the first recirculated pulse more nearly corresponds to the power of the input pulse. to this end, a multi-state attenuator 94, shown as a two state attenuator for this exemplary embodiment, is inserted into the memory loop. The two state attenuator 94 includes a pair of single pole double throw switches 95a and 95b which serve to couple either a low attenuation path 96 or a high attenuation path 97 into the loop during the first recirculation time. The single pole double throw switches 95a and 95b are controlled by means of an attenuator logic network 93. A directional coupler 92 couples the memory input pulse A to the attenuator logic 93 as well as to the phase correlator 14.

The attenuator logic network 93 includes a dual amplitude comparator to determine the relative level of the input signal power and a decode network for decoding the output of the comparator. If the input level power does not exceed either of two threshold levels the comparator output is 00. This corresponds to the zero input (noise) condition where frequency memory is not required. If the input power level exceeds the first threshold, the comparator output is 1.0 and the decode network sets the two state step attenuator to the high loss (resistive path 97) position. This adjusts the first recirculated pulse amplitude to a desired amplitude level which more nearly corresponds with the input pulse amplitude (e.g., within 8 db of the input pulse amplitude). If the input pulse power exceeds both thresholds, the comparator output is 11 and the decode network sets the two step attenuator to the low loss position. This adjusts the first recirculated pulse amplitude so as to more nearly correspond to the higher level input pulse amplitude. During the second and the ensuring recirculations, the output of the comparator is 00 and the decode logic responds thereto to set the two state step attenuator to the low loss position.

Figure 8:
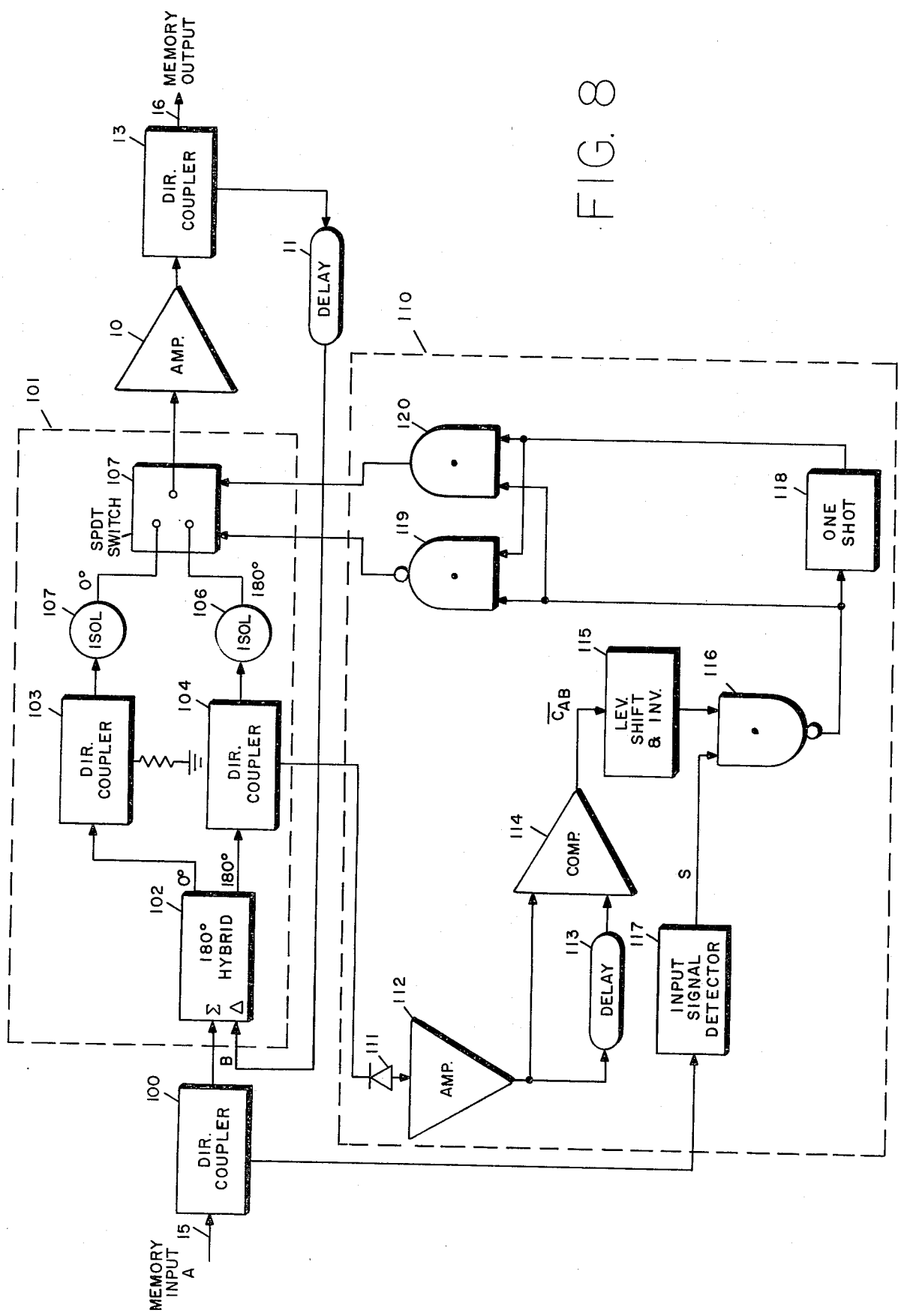
FIG. 8 is a block diagram of another embodiment of the invention which employs two state phase correction.

In the embodiment illustrated in FIG. 8 a phase shifter 101 also serves as the phase correlator to provide two state (0°, 180°) phase correction. To this end, the phase shifter 101 includes a 180° hybrid network 102 having sum ($\epsilon$) and difference ($\Delta$) input ports. The $\epsilon$ input port receives the memory input signal A via a directional coupler 100. The $\Delta$ input port receives the first recirculated pulse B from the phase delay 11. The 0° output port of the hybrid network 102 is coupled via a directional coupler 103 and an isolator 105 to one switching terminal of a single pole double throw switch 107. The 180° output port of the hybrid network 102 is coupled via a directional coupler 104 and an isolator 106 to the other switching terminal of the switch 107. The 180° output port of the network 102 also serves to provide the phase correction signal which is coupled by the directional coupler 104 to a switch logic control section 110.

The control logic section 110 is operative to maintain the switch 107 in the 0° position when no signal is being stored in the memory. When an input signal A is received, the switch 107 remains in the 0° position until the phase correlation interval. During the phase correlation interval the switch 107 either remains in the 0° position or is switched to the 180° position dependent upon the phase correction signal at the 180° output of the hybrid network 102.

Figure 9:
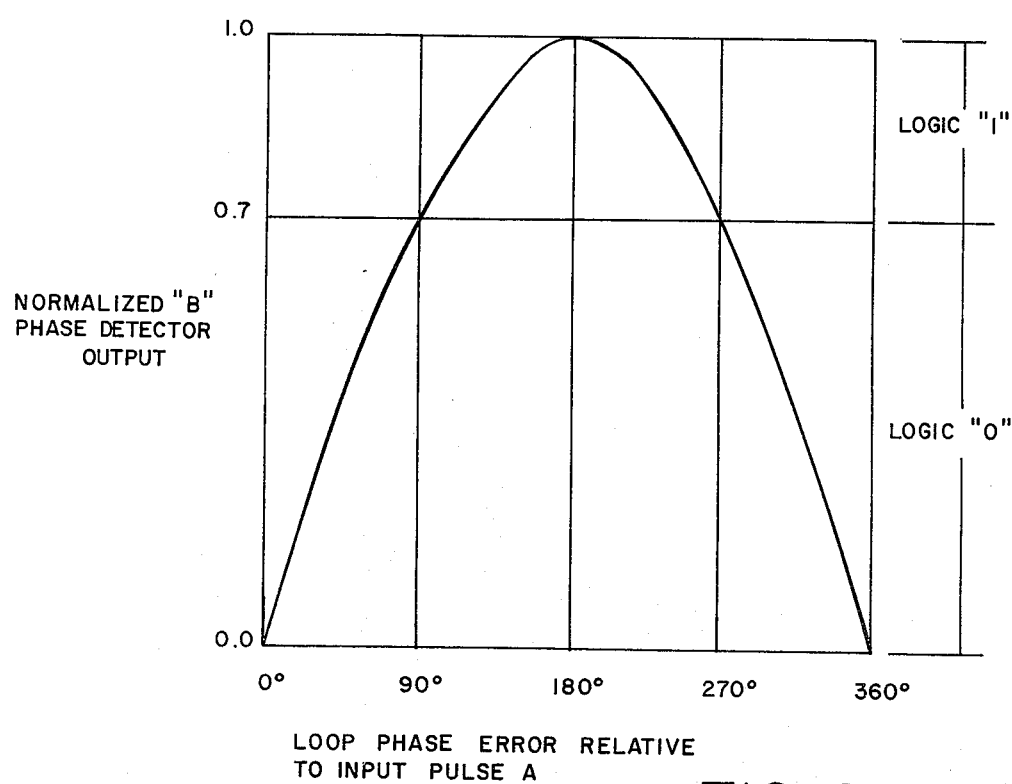
FIG. 9 is a graph showing the normalized phase detector amplitude as a function of the loop phase error.

The normalized amplitude of the phase correction signal is shown as a function of a loop phase error relative to the input pulse A in FIG. 9. As there shown, phase correction signal amplitude is maximum for a phase error of 180° and minimum for a phase error of 0°. The 0° phase error condition corresponds to the recirculated pulse B at the $\Delta$ input port being 180° out of phase with the input pulse A. This will result in a subtraction of the signals A and B so that the amplitude of the signal at the 180° output port will be substantially zero. On the other hand, the 180° phase error condition corresponds to the recirculated pulse B being in phase with the input pulse A. This will result in the A and B signals being added to one another to provide a maximum amplitude signal at the 180° output port.

For the embodiment illustrated in FIG. 8, the logic section 110 is designed to respond to amplitude levels in excess of the 0.7 normalized level to produce a logic 1 and to levels below the 0.7 level to produce a logic 0. The logic 1 and logic 0 correspond to 180° and 0° phase shifts, respectively.

Logic section 110 includes a diode detector 111 which receives the phase correction signal from the directional coupler 104. The output of the diode detector 111 is amplified by an amplifier 112 and then applied as an input to a comparator 114. The comparator 114 serves to detect amplitude levels which are greater than the 0.7 normalized amplitude level. This could be done by comparing the detected signal with a fixed d.c. reference. However, the use of a fixed d.c. reference limits the dynamic range of input signal power levels upon which the frequency memory can operate.

In order to enlarge the input signal dynamic range, the comparator 114 is operative to compare the detected phase correction signal with a delayed version of itself. The delay of line 113 is made substantially equal to the delay of the memory loop line 11 such that during the phase correlation interval the amplitude of the phase correction signal is actually being compared with the amplitude of the input signal A. This happens because the phase correction signal at the 180° output port of the network 102 is essentially the input signal A prior to the appearance of the first recirculated pulse B at the $\Delta$ input port thereof. Accordingly, for a 0° phase error (minimum phase correction signal amplitude) the output of the comparator 114 will correspond to a logic 0. On the other hand, for a 180° phase error (maximum phase correction signal amplitude) the output of the comparator 114 will correspond to a logic 1).

The complement output $\overline{C}_{AB}$ of the comparator 114 is applied via a level shift and inverting network 115 to one input of a NAND gate 116. The level shift and inverting network 115 serves to convert the output of comparator 114 to the logic 1 and 0 signal levels employed by the logic gate 116. The NAND gate 116 is strobed or sampled during the phase correlation interval by a sampling signal S provided by an input signal detector circuit 117. The input signal detector circuit 117 responds to the start of the input signal A to produce the sample signal S during the phase correlation interval. To this end, the input signal detector 17 may be substantially similar to the signal detector circuit 70 shown in FIG. 5.

The output signal from the NAND gate 116 is processed in substantially the same way as the output signal of NAND gate 56 in FIG. 5. To this end, the output of NAND gate 116 is coupled as one input to both the AND gate 120 and the NAND gate 119. The output of gate 116 is also coupled by way of a oneshot multivibrator 118 to the other input terminals of gates 119 and 120. The one shot 118 has a time constant which is equal to the desired frequency memory storage time.

In operation, the output of NAND gate 116 is a 1 at all times prior to and after the sampling period. This results in the output of gate 119 being a 0 and the output of gate 120 being a 1. The 1 at the output of gate 120 is operative to place the single pole double throw switch 107 in the 0° position. If the complement output $C_{AB}$ of comparator 114 is a 0 (phase shift of 180° required), the output of gate 116 will become a 0 during the sample time. This will cause the output of gate 120 to become a 0 and the output of gate 119 to become a 1. The one shot 118 stores the 0 output of gate 116 for the entire storage period so that the output states of the gates 119 and 120 remain as 1 and 0, respectively. When the output of gate 119 is a 1, the single pole double throw switch 107 is placed in the 180° position. At the termination of the storage time the one shot 118 returns to its initial condition so that the outputs of gates 119 and 120 become 0 and 1, respectively. This causes the switch 107 to be placed in the zero degree position.

The storage time of a frequency memory is limited due to the gain of the TWT amplifier. This causes broadband noise to build up as the stored pulse continues to circulate. Eventually, the TWT saturates and the stored pulse becomes severely distorted. In the embodiments described thus far, the loop phase delay could be typically on the order of 50 to 150 nanoseconds such as might be achieved by coaxial cable type delay lines.

Figure 10:
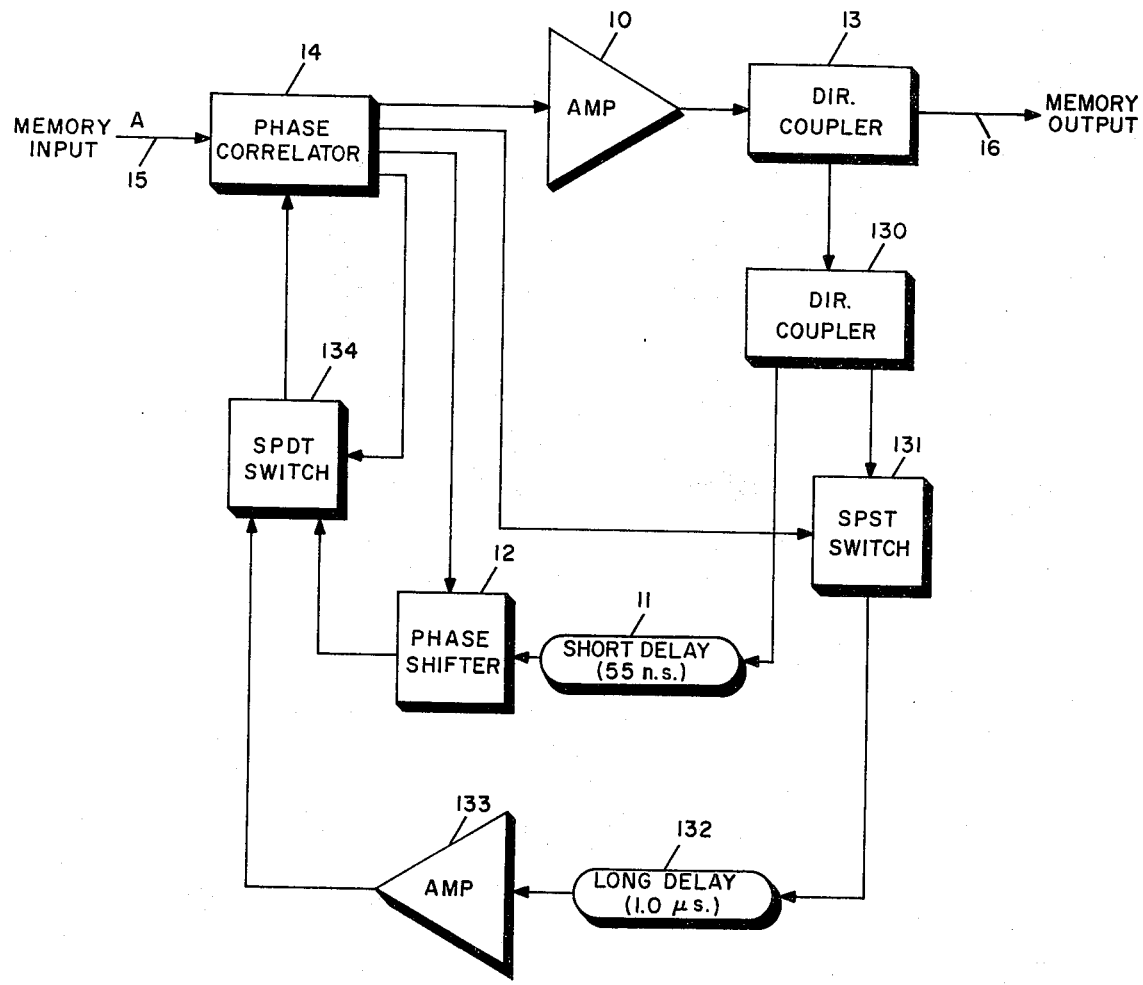
FIG. 10 is a block diagram of still another embodiment which provides a relatively long term storage time.

In the FIG. 10 embodiment, a short term loop and a long term loop are employed so as to provide a longer term memory. The short term loop essentially consists of the same components as the FIG. 1 embodiment and operates in essentially the same manner to correct the phase delay of the first recirculated pulse in the short term loop. By way of example, the short delay 11 is illustrated to have a delay of 55 nanoseconds.

After allowing about 0.2 microseconds for the short term loop to correct the phase error, a single pull single throw switch 131 is then closed to allow the phase corrected stored signal to be loaded into the longer loop delay line 132. After delay line 132 is loaded (about 1.0 microseconds after switch 131 is closed), a single pull double throw switch 134 is switched to couple the long term loop to the phase correlator 14. Previous to this time the switch 134 had been coupling the short term loop to the phase correlator 14 to allow the phase correction and longer term delay line loading process to take place. In this manner only 19 recirculations of the 1 microsecond stored pulse are required to obtain 20 microseconds of frequency memory storage.

The phase correlator 14 includes additional circuitry (not shown) to control the switching of the switches 131 and 134. This circuitry, for example, may take forms similar to the strobe or sample pulse generator circuitry shown in FIG. 5 with appropriate delays for the one shots to provide the switching pulses at the proper times.

There has been described an improved frequency memory in which the phase delay of an oscillatory loop is adjusted so as to concentrate the output power of the memory at the frequency of the input pulse of periodic signal. This phase adjustment is achieved during the time of the first recirculated pulse by means of correlating the first recirculated pulse with the input pulse so as to derive therefrom phase correction information. The phase correction information is processed to provide drive signals which operate a phase adjustor within the loop. It should be apparent that the logic diagrams shown throughout the drawings are for the purpose of illustration only and that other designs may be employed. In addition, it is to be noted that the multistate attenuation feature (FIG. 7) and the first recirculated pulse phase error feature (FIG. 6) may be employed with each other and with any of the other illustrated embodiments.

It will thus be seen that the objects set forth above, among those made apparent from the preceding description, are efficiently attained and, since certain changes may be made in the above constructions, without departing from the scope of the invention, it is intended that all matter contained in the above description or shown in the accompanying drawings shall be interpreted as illustrative and not in a limiting sense.

What is claimed is:
1. A frequency memory comprising
    an amplifier and a delay line coupled in an oscillatory loop;
    means for applying an input pulse of periodic signal to said loop, said loop responding thereto to recirculate said pulse;
    means for correlating said input pulse with the first recirculated version of itself; and
    means responsive to said correlating means to adjust the phase delay of said loop in a direction to optimize the memory output power at the frequency of said periodic signal.

2. Memory apparatus as set forth in claim 1 wherein the delay interval of said delay line is less than the width of said input pulse whereby said correlation occurs prior to the termination of said input pulse.

3. Memory apparatus as set forth in claim 2 wherein said correlation means includes
    a signal combining means for combining said input pulse and said first recirculated version so as to produce first and second output signals which are 180° out of phase with one another,
    a comparator for comparing said first output signal of the signal combiner with a delayed version of itself to produce a bivalued phase correction signal; and wherein said phase adjusting means responds to said phase correction signal to couple either said first or said second output signal of the signal combiner in said oscillatory loop in accordance with the value of said phase correction signal.

4. Memory apparatus as set forth in claim 3 wherein said phase adjusting means includes,
   a switch operable to couple either the first or the second output signal of said signal combiner means in said oscillatory loop; and
   a control circuit responsive to said phase correction signal to control the switching position of said switch.

5. Memory apparatus as set forth in claim 4 wherein said phase correlation signal has a first of its two values prior to the receipt of said input pulse and the second of its two values whenever the phase difference between the first input pulse and the first recirculated version is greater than a predetermined amount; and wherein said control circuit responds to said first and second phase correction signal values to place said switch in its second and first switching positions, respectively.

6. Memory apparatus as set forth in claim 5 and further including
   means for sampling the output of said comparator during the time that the input pulse and the first recirculated version overlap one another in time such that the phase correction signal has its first value at all times except for the sample period and either its first or second value during the sample period; and
   wherein said control circuit includes
      means for storing the occurrence of the second value of the phase correction signal during the sample period; and
      gating means responsive to said phase correction signal and to said storage means for controlling the switching position of said switch.

7. Memory apparatus as set forth in claim 2 wherein said correlating means produces a plurality of phase correction signals; and wherein said phase adjusting means responds to said phase correction signals to adjust the phase delay of said loop in increments of 90°.

8. Memory apparatus as set forth in claim 7 wherein said correlating means includes
   first and second signal combining means for combining said input pulse with said first recirculated version and with said first recirculated version shifted 90° in phase, respectively, each said signal combining means producing first and second output signals 90° out of phase with one another;
   comparator means for comparing the second output signal of said first signal combiner with each of the first and second output signals of the second signal combiner to produce first and second bivalued comparator output signals, respectively; and
   gating means responsive to said comparator output signals for producing first and second ones of said phase correction signals; and wherein the first output signal of said first signal combining means is coupled in said oscillatory loop.

9. Memory apparatus as set forth in claim 8 wherein said phase adjusting means includes
   a four state phase shifter coupled within said oscillatory loop; and
   a control circuit responsive to said phase correction signals to control the phase state of said phase shifter.

10. Memory apparatus as set forth in claim 9 wherein said gating means includes
    a first gating network for producing said first phase comparison signal as a function only of said first comparator output signal; and
    a second gating network for producing said second phase correction signal whenever the first and second comparator output signals are identical in value.

11. Memory apparatus as set forth in claim 10 wherein said four state phase shifter includes first and second shifting networks connected in cascade, the first phase shifting network having phase shift positions of 0° and 180° and the second phase shifting network having phase shift positions of 0° and 90° and wherein said control circuit responds to the first and second values of said first phase correction signal to place said first network in the 0° and 180° phase shift positions, respectively, and further responds to the first and second values of said second phase correction signal to place said second network into its 0° and 90° phase shift position, respectively.

12. Memory apparatus as set forth in claim 11 and further including
    means for sampling said first and second gating networks during the time that the input pulse and the first recirculated version overlap one another in time such that the first and second phase correction signals have their first values at all times except for the sample period and either their first or second values during the sample period; and
    wherein said control circuit includes
       first and second means for storing the occurrences of the second values of the first and second phase correction signals, respectively, during the sample period; and
       first and second gating circuits responsive to said first and second phase correction signals and to said first and second storage means, respectively, for controlling the phase shift positions of said first and second phase shifting networks, respectively.

13. Memory apparatus as set forth in claim 2 and further including
    means responsive to the power level of the input pulse to adjust the signal attenuation within said loop during the first recirculation so that the power level of the first recirculated pulse more nearly corresponds to the power level of the input pulse.

14. Memory apparatus as set forth in claim 13 wherein said loop attenuating adjusting means includes
    a multi-state attenuator coupled within said loop; and
    an attenuator control network responsive to the power level of said input signal to place said loop attenuator in an attenuation state which allows the power level of the first recirculated pulse to correspond to the power level of the input pulse.

15. Memory apparatus as set forth in claim 2 and further including
    means responsive to said input pulse for preventing the first recirculated pulse from again traversing the loop.

16. Memory apparatus as set forth in claim 15 wherein said prevention means includes
    a first switch operative in first and second positions to couple the recirculated pulses from the output of said phase adjusting means to either a first dummy load or into said loop for recirculation, respectively;
    a second switch operative in first and second positions to couple the output of the phase adjusting means to either said correlating means or to a second dummy load, respectively; and
    a switch control network responsive to said input pulse to place said first and second switches in their respective first positions for the duration of said input pulse and to thereafter place said first and second switches into their respective second positions.

17. Memory apparatus as set forth in claim 2 wherein the aforesaid delay line is hereafter referred to as the first delay line; and further including
    a second delay line having a delay which is longer than that of the first delay line;
    first switching means responsive to said input pulse for loading said second delay line with the signal stored in said loop after said correlation occurs; and
    second switching means responsive to said input pulse for decoupling said first delay line from and coupling said second delay line into said loop after said second delay line has been loaded.

* * * * *